(12) United States Patent
Lee

(10) Patent No.: US 8,040,306 B2
(45) Date of Patent: Oct. 18, 2011

(54) DISPLAY DRIVING CHIP

(75) Inventor: Min Hyung Lee, Cheongjoo-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 1054 days.

(21) Appl. No.: 11/863,428

(22) Filed: Sep. 28, 2007

(65) Prior Publication Data

US 2008/0150857 A1 Jun. 26, 2008

(30) Foreign Application Priority Data

Dec. 20, 2006 (KR) .................. 10-2006-0131291

(51) Int. Cl.
*G09G 3/36* (2006.01)
(52) U.S. Cl. ...................... 345/87; 345/206
(58) Field of Classification Search .............. 345/206, 345/87; 257/678, 668, 797
See application file for complete search history.

(56) References Cited

U.S. PATENT DOCUMENTS

| 6,559,549 | B1 * | 5/2003 | Cho ............................ 257/797 |
| 6,713,850 | B1 * | 3/2004 | Yuan et al. .................. 257/668 |
| 7,329,597 | B2 * | 2/2008 | Chung et al. ................ 438/611 |
| 7,403,256 | B2 * | 7/2008 | Ting ............................ 349/149 |
| 2003/0080953 | A1 * | 5/2003 | Ting ............................ 345/206 |
| 2006/0113648 | A1 * | 6/2006 | Chung et al. ................ 257/678 |
| 2006/0227279 | A1 * | 10/2006 | Ting ............................ 349/151 |
| 2007/0008689 | A1 * | 1/2007 | Park ............................ 361/683 |
| 2008/0128902 | A1 * | 6/2008 | Chung et al. ................ 257/735 |

FOREIGN PATENT DOCUMENTS

| JP | 19960203985 | 2/1998 |
| KR | 10-2002-0023768 | 11/2003 |

* cited by examiner

*Primary Examiner* — Nitin Patel
(74) *Attorney, Agent, or Firm* — Saliwanchik, Lloyd & Eisenschenk

(57) ABSTRACT

Disclosed is a display driving chip of a semiconductor chip. According to an embodiment, the display driving chip comprises, input/output (I/O) pads each electrically connected to a lower interconnection on an active area, the I/O pads forming a perimeter on an inner peripheral surface of the active area, and dummy pads formed on the active area within the perimeter of I/O pads.

17 Claims, 3 Drawing Sheets

DISPLAY DRIVING CHIP

CROSS-REFERENCE TO RELATED APPLICATION

The present application claims the benefit under 35 U.S.C. §119 of Korean Patent Application No. 10-2006-0131291, filed Dec. 20, 2006, which is hereby incorporated by reference in its entirety.

BACKGROUND

A Thin Film Transistor-Liquid Crystal Display (TFT-LCD) having excellent color reproduction and thin thickness has been developed.

In order to drive such an LCD, a driving chip including a driver Integrated Circuit (IC) for applying signals is required.

With the increase in the number of pixels of the LCD, the number of Input/Output (IO) pads of the driving chip is also increased.

FIG. 1 is a view showing a driving chip used for an LCD according the related art.

Referring to FIG. 1, I/O pads 3 are arranged in a row along the edge of the driving chip 1 outside of an active region 2.

The pad array including the I/O pads 3 as described above is used for connecting an LCD panel to the driving chip 1 through a Tape-Automated Bonding (TAB) or a Chip-On-Film (COF) scheme.

However, in the pad array as described above, since great pressure is applied to the I/O pads 3 during the bonding process of the LCD panel and the driving chip 1, a crack may occur in the driving chip 1.

BRIEF SUMMARY

Embodiments of the present invention provide a display driving chip capable of minimizing creation of a crack during the bonding process by forming dummy pads at peripheral portions of the driving chip. The dummy pads can be positioned by I/O pads and are not electrically connected to an interconnection in the driving chip.

According to an embodiment of the present invention, there is provided a display driving chip comprising: an active area in which a lower interconnection is formed; input/output (I/O) pads electrically connected to the lower interconnection of the active area, the I/O pads forming a perimeter in an outer region of the active area; and dummy pads formed on the active area within the perimeter of I/O pads.

DETAILED DESCRIPTION

Hereinafter, a display driving chip according to an embodiment of the present invention will be described with reference to the accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
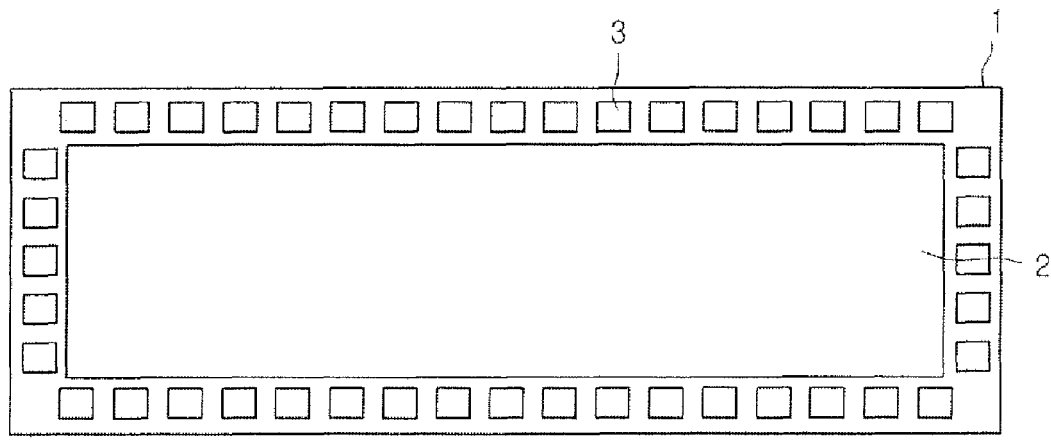
FIG. 1 is a view schematically showing a driving chip according the related art.
Figure 2:
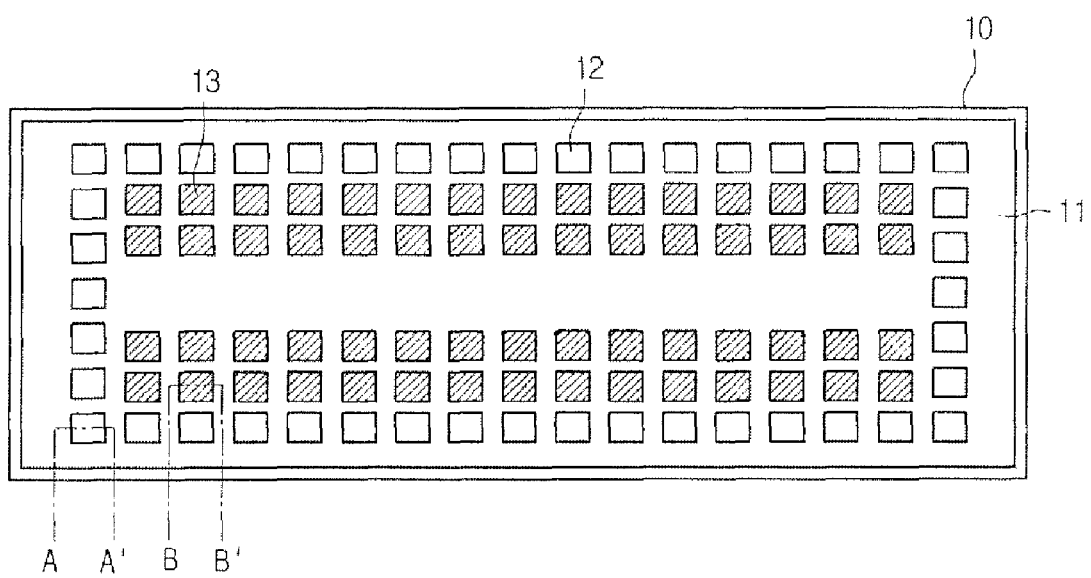
FIG. 2 is a view schematically showing a display driving chip according to an embodiment of the present invention.

Referring to FIG. 2, a pad array including I/O pads 12 and dummy pads 13 can be formed in an active area 11 of a driving chip 10.

The driving chip 10 can be formed on the active area 11 of a semiconductor substrate.

Figure 3:
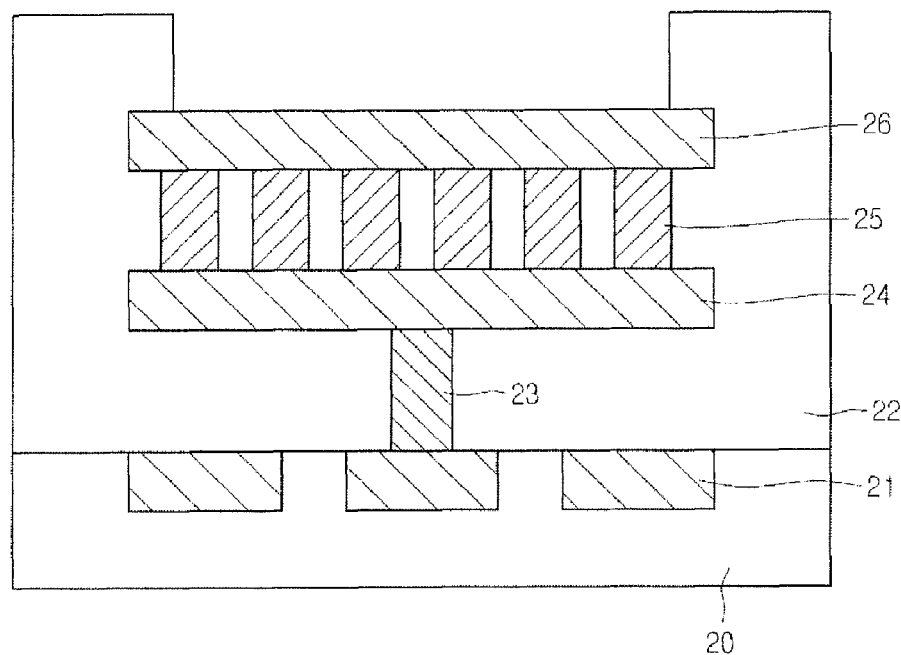
FIG. 3 is a cross-sectional view of an I/O pad taken along line A-A' of FIG. 2 according to an embodiment of the present invention.
Figure 4:
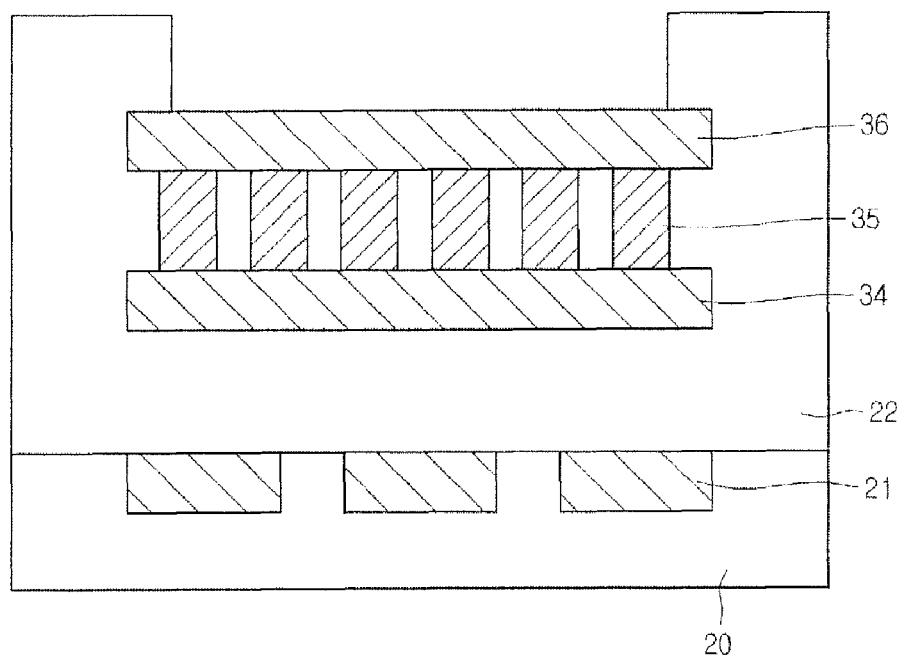
FIG. 4 is a cross-sectional view of a dummy pad taken along line B-B' of FIG. 2 according to an embodiment of the present invention.

Referring to FIGS. 3 and 4, a lower interconnection 21 for an operation of the driving chip 10 can be formed on the semiconductor substrate 20 having a driving circuit (not shown). An interlayer dielectric layer 22 can be formed on the lower interconnection 21, and a pad array is formed on the interlayer dielectric layer 22.

The pad array includes the I/O pads 12 and dummy pads 13.

The dummy pads 13 are formed within the perimeter of I/O pads 12 and connected to the panel of a display apparatus, such as an LCD, through a TAB or a COF scheme, thereby operating the device. Although the pad array is bonded to the panel of the LCD, this is only illustrative purposes, and the pad array can be applied to other apparatuses.

The I/O pads 12 can be formed on the active area 11 of the driving chip 10. In particular, the I/O pads 12 can form a perimeter in an inner peripheral surface of the active area 11, and can each be electrically connected to a lower interconnection 21 formed in the semiconductor substrate 20. Accordingly, as the pad array is bonded to an electronic appliance, the electronic appliance is actually operated.

The dummy pads 13 can be formed in an inner area of the active area within the perimeter of I/O pads 12 in an array structure of one to ten rows.

Specifically, the dummy pads 13 can have the same shape and size as the I/O pads 12. Accordingly, when another electronic appliance is bonded to the pad array, pressure applied to the I/O pads 12 is dispersed, so that a crack can be inhibited from occurring in the I/O pads 12.

Although the dummy pads 13 can have the shape and size as the I/O pads 12, the dummy pads 13 are not electrically connected to the lower interconnection 21 formed in the semiconductor substrate 20, so the dummy pads 13 can disperse pressure during the boding process of the I/O pads 12.

FIG. 3 is a cross-sectional view showing the interconnection of an I/O pad 12.

Referring back to FIG. 3 an interlayer dielectric layer 22 can be formed on the semiconductor substrate 20 in which devices (not shown) for a circuit operation and the lower interconnection 21 are formed.

A contact 23 for connection to the lower interconnection 21 can be formed through the interlayer dielectric layer 22.

A first metal pad 24 connected to the contact 23 can be formed on the interlayer dielectric layer 22.

A plurality of vias 25 can be formed on the first metal pad 24 while being spaced apart from each other at a predetermined interval.

A second metal pad 26 can be formed on the vias 25. The second metal pad 26 is electrically connected to the lower interconnection 21 through the contact 23. The second metal pad 26 operates in bonding of the driving chip 10.

FIG. 4 is a cross-sectional view showing the interconnection of a dummy pad 13.

Referring back to FIG. 4, the interlayer dielectric layer 22 is formed on the semiconductor substrate 20 in which devices (not shown) for a circuit operation and the lower interconnection 21 are formed.

A first metal pad 34 can be formed on the interlayer dielectric layer 22.

A plurality of vias 35 can be formed on the first metal pad 34 while being spaced apart from each other at a predetermined interval. A second metal pad 36 can be formed on the vias 25.

Since the second metal pad 36 is not connected to the lower interconnection 21, the second metal pad 36 does not actually operate.

However, the dummy pads 13 formed as described above are located adjacent to the inner lateral side of the I/O pads 12 and disperse pressure during the bonding process of the I/O pads 12, thereby minimizing damage of the I/O pads 12.

As shown in FIGS. 3 and 4, the I/O pad 12 and the dummy pad 13, which are part of the pad array, have the same structure and shape.

Specifically, the I/O pad 12 has a dual structure that includes the first and second metal pads 24 and 26 and the dummy pad 13 also has a dual structure that includes the first and second metal pads 34 and 36.

Further, the first and second metal pads 24 and 26 of the I/O pad 12, and the first and second metal pads 34 and 36 of the dummy pad 13 are interconnected through one or more vias 25 and 35, respectively, thereby dispersing pressure during the bonding process of the pad array.

Further, intervals among all pads of the pad array, i.e. an interval between the I/O pads 12, between the dummy pads 13, and between the I/O pad 12 and the dummy pad 13 may be constantly formed in a range of 10 μm to 500 μm.

Furthermore, the first and second metal pads 24 and 26 of the I/O pad 12, and the first and second metal pads 34 and 36 of the dummy pad 13 can include Cu, AlCu, W, Ti or Co.

Figure 5:
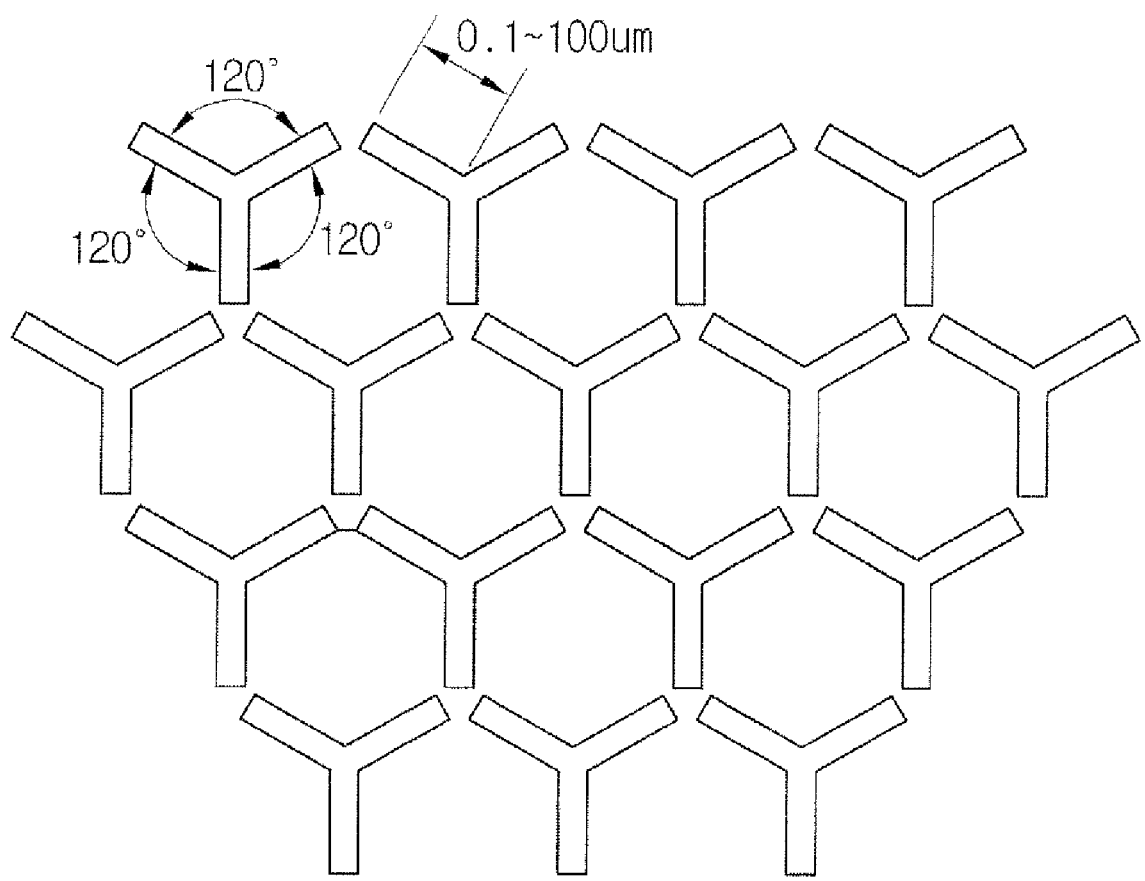
FIG. 5 is a plan view showing the via illustrated in FIGS. 3 and 4.

FIG. 5 is a plan view showing an embodiment of the vias 25 and 35 formed in the I/O pad 12, and the dummy pad 13, respectively.

The vias 25 and 35 can have a Y shape to support the first and second metal pads 24 and 26, and the first and second metal pads 34 and 36.

For example, the height of the vias 25 and 35 between first pad (24, 34) and the second pad (26, 36) can be 0.1 μm to 20 μm, and the length of one branch of the Y-shaped via can be 0.1 μm to 100 μm.

The vias 25 and 35 can be formed in plurality with an area ratio of 1% to 80% with respect to areas of the first and second metal pads 24 and 26, and areas of the first and second metal pads 34 and 36.

Each of the vias 25 and 35 can include Cu, AlCu, W, Ti or Co. The material can be selected to be the same as that of the chip interconnection.

The vias 25 and 35 formed as described above support the first and second metal pads 24 and 26 of the I/O pad 12, and the first and second metal pads 34 and 36 of the dummy pad 13, respectively, thereby dispersing pressure applied to the I/O pad 12 and thus inhibiting cracking during the bonding process of the pad array.

According to the display driving chip of embodiments of the present invention, the pad array including the I/O pads and the dummy pads can be formed in the active area, thereby minimizing the size of the driving chip and thus reducing the manufacturing cost.

Further, the dummy pads, which are not electrically connected to the interconnection, can be formed around the I/O pads, so that a crack can be inhibited from occurring in the driving chip due to pressure during the bonding process.

Furthermore, according to embodiments, each of the I/O pad and the dummy pad includes the first and second metal pads, and the first and second metal pads are interconnected through a plurality of vias, so that damage of the driving chip due to pressure during the bonding process can be minimized.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display driving chip, comprising:
   input/output (I/O) pads each electrically connected to a lower interconnection on an active area, wherein the I/O pads form a perimeter on an inner peripheral surface of the active area; and
   dummy pads on the active area within an inner peripheral surface of the perimeter of I/O pads.

2. The display driving chip according to claim 1, wherein the dummy pads are not electrically connected to the lower interconnections on the active area.

3. The display driving chip according to claim 1, wherein the I/O pads and the dummy pads each have a dual structure comprising a first metal pad and a second metal pad.

4. The display driving chip according to claim 1, wherein an interval between each I/O pad and each dummy pad is in a range of 10 λm to 500 μm.

5. The display driving chip according to claim 1, wherein the I/O pads each comprise:
   a first metal pad connected to the lower interconnection on a semiconductor substrate;
   at least one via on the first metal pad; and
   a second metal pad on the via.

6. The display driving chip according to claim 5, wherein the at least one via has a Y shape.

7. The display driving chip according to claim 6, wherein the at least one via has a height of 0.1 μm to 20 μm between the first metal pad and the second metal pad.

8. The display driving chip according to claim 6, wherein the length of one branch of the at least one Y-shaped via is 0.1 μm to 100 μm.

9. The display driving chip according to claim 5, wherein the at least one via comprises Cu, AlCu, W, Ti, Ta or Co.

10. The display driving chip according to claim 5, wherein the at least one via has an area ratio of 1% to 80% with respect to an area of the first and second metal pads.

11. The display driving chip according to claim 1, wherein the dummy pad comprises:
- a first metal pad on an interlayer dielectric layer on a semiconductor substrate;
- at least one via on the first metal pad; and
- a second metal pad on the via.

12. The display driving chip according to claim 11, wherein the at least one via has a Y shape.

13. The display driving chip according to claim 12, wherein the at least one via has a height of 0.1 μm to 20 μm between the first metal pad and the second metal pad.

14. The display driving chip according to claim 12, wherein the length of one branch of the at least one Y-shaped via is 0.1 μm to 100 μm.

15. The display driving chip according to claim 11, wherein the at least one via comprises Cu, AlCu, W, Ti, Ta or Co.

16. The display driving chip according to claim 11, wherein the at least one via has an area ratio of 1% to 80% with respect to an area of the first and second metal pads.

17. The display driving chip according to claim 1, wherein the I/O pads and the dummy pads each comprise Cu, AlCu, W, Ti, Ta or Co.

* * * * *